United States Patent
Cho et al.

(10) Patent No.: US 11,695,411 B2
(45) Date of Patent: Jul. 4, 2023

(54) TRANSMITTER AND OPERATING METHOD OF TRANSMITTER

(71) Applicant: Electronics and Telecommunications Research Institute, Daejeon (KR)

(72) Inventors: Min-Hyung Cho, Daejeon (KR); Young-deuk Jeon, Sejong-si (KR); In San Jeon, Daejeon (KR); Jin Ho Han, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/484,375

(22) Filed: Sep. 24, 2021

(65) Prior Publication Data

US 2022/0158634 A1    May 19, 2022

(30) Foreign Application Priority Data

Nov. 18, 2020  (KR) .................. 10-2020-0154349
Apr. 8, 2021   (KR) .................. 10-2021-0045814

(51) Int. Cl.
*H04B 1/04*     (2006.01)
*H03K 17/56*    (2006.01)
(Continued)

(52) U.S. Cl.
CPC .............. *H03K 17/56* (2013.01); *H03K 5/01* (2013.01); *H03K 19/0005* (2013.01);
(Continued)

(58) Field of Classification Search
CPC ...... H03K 5/01; H03K 17/56; H03K 19/0005; H03K 19/017545; H03K 19/01825;
(Continued)

(56) References Cited

U.S. PATENT DOCUMENTS 7,215,144 B2     5/2007  Mitby et al.
7,619,448 B2 *  11/2009  Wu ................ H03K 19/018528
                                                      327/108
(Continued)

FOREIGN PATENT DOCUMENTS

KR    10-2011-0012805    2/2011

OTHER PUBLICATIONS

Hae-Kang Jung et al., A 4.35Gb/s/pin LPDDR4 I/O Interface with Multi-VOH Level, Equalization Scheme, and Duty-Training Circuit for Mobile Applications, 2015 Symposium on VLSI Circuits Digest of Technical Papers, 2015.

*Primary Examiner* — Kurtis R Bahr
(74) *Attorney, Agent, or Firm* — Kile Park Reed & Houtteman PLLC

(57) ABSTRACT

Disclosed is a transmitter which includes a channel driver that includes a pull-up transistor and a pull-down transistor connected between a power node and a ground node and outputs a voltage between the pull-up transistor and the pull-down transistor as a transmit signal, and a pre-driver that controls the pull-up transistor and the pull-down transistor in response to a driving signal and controls the channel driver such that the transmit signal is overshot at a rising edge of the driving signal and the transmit signal is undershot at a falling edge of the driving signal.

19 Claims, 12 Drawing Sheets

(51) Int. Cl.
*H03K 5/01* (2006.01)
*H04L 1/00* (2006.01)
*H03K 19/20* (2006.01)
*H03K 19/018* (2006.01)
*H03K 19/00* (2006.01)
*H03K 19/0185* (2006.01)
*H03K 19/0175* (2006.01)
*H03K 5/00* (2006.01)

(52) U.S. Cl.
CPC ............... *H03K 19/01825* (2013.01); *H03K 19/017545* (2013.01); *H03K 19/018557* (2013.01); *H03K 19/20* (2013.01); *H04L 1/0009* (2013.01); *H04L 1/0033* (2013.01); *H03K 2005/00013* (2013.01)

(58) Field of Classification Search
CPC ............ H03K 19/018557; H03K 19/20; H04L 1/0009; H04L 1/0033
See application file for complete search history.

(56) References Cited

U.S. PATENT DOCUMENTS

| | | | |
|---|---|---|---|
| 8,390,317 B2 | 3/2013 | Bae et al. | |
| 8,466,982 B2* | 6/2013 | Liu | H04L 25/0276 |
| | | | 348/222.1 |
| 8,928,365 B2* | 1/2015 | Li | H03K 19/0005 |
| | | | 327/112 |
| 9,300,331 B2* | 3/2016 | Liu | H04L 25/0272 |
| 9,998,121 B2 | 6/2018 | Choi | |
| 2013/0159597 A1 | 6/2013 | Cheong | |
| 2018/0145671 A1 | 5/2018 | Lee et al. | |
| 2018/0260353 A1* | 9/2018 | de Haas | H04L 12/40032 |
| 2021/0407565 A1* | 12/2021 | Contreras | G11C 7/1048 |

* cited by examiner

TRANSMITTER AND OPERATING METHOD OF TRANSMITTER

CROSS-REFERENCE TO RELATED APPLICATIONS

This application claims priority under 35 U.S.C. § 119 to Korean Patent Application Nos. 10-2020-0154349 filed on Nov. 18, 2020 and 10-2021-0045814 filed on Apr. 8, 2021, in the Korean Intellectual Property Office, the disclosures of which are incorporated by reference herein in their entireties.

BACKGROUND

Embodiments of the present disclosure relate to an electronic device, and more particularly, relate to a transmitter transmitting a signal with the reduced area and complexity and an operating method of the transmitter.

An electronic device may include various components such as a central processing unit, a random access memory, a modem, and a storage device. The components of the electronic device are configured to exchange data with each other. As performances of the components of the electronic device are improved, a speed at which data are exchanged between the components of the electronic device is increasing.

As a data communication speed of the components of the electronic device increases, the probability that an error occurs at data transmitted/received between the components may increase. Accordingly, there are required various schemes capable of reducing an error while improving the data communication speed of the components of the electronic device.

SUMMARY

Embodiments of the present disclosure provide a transmitter capable of reducing an error of a transmit signal while reducing the area and complexity and an operating method of the transmitter.

According to an embodiment, a transmitter includes a channel driver that includes a pull-up transistor and a pull-down transistor connected between a power node and a ground node and outputs a voltage between the pull-up transistor and the pull-down transistor as a transmit signal, and a pre-driver that controls the pull-up transistor and the pull-down transistor in response to a driving signal and controls the channel driver such that the transmit signal is overshot at a rising edge of the driving signal and the transmit signal is undershot at a falling edge of the driving signal.

As an embodiment, the pre-driver causes the overshoot and the undershoot of the transmit signal by adjusting a level of a pull-up signal to be applied to the pull-up transistor and a level of a pull-down signal to be applied to the pull-down transistor.

As an embodiment, the pre-driver adjusts the pull-up signal to a first level at the rising edge of the driving signal and adjusts the pull-up signal to a second level lower than the first level after a given time.

As an embodiment, the pre-driver adjusts the pull-up signal to a third level lower than the second level at the falling edge of the driving signal.

As an embodiment, the second level is a power supply voltage.

As an embodiment, the first level is two times a power supply voltage.

As an embodiment, the pre-driver adjusts the pull-down signal to a first level at the falling edge of the driving signal and adjusts the pull-down signal to a second level lower than the first level after a given time.

As an embodiment, the pre-driver adjusts the pull-down signal to a third level lower than the second level at the rising edge of the driving signal.

As an embodiment, the pre-driver includes a voltage control circuit that receives the driving signal and to output one of a first voltage and a second voltage in response to the driving signal, a first transistor that outputs an output voltage of the voltage control circuit as the pull-up signal when the driving signal is at a first level, and a second transistor configured to output a ground voltage as the pull-up signal when the driving signal is at a second level.

As an embodiment the voltage control circuit includes a delay that delays and output the driving signal, an inverter that inverts and outputs an output signal of the inverter, a first capacitor that includes a first end connected between an output of the delay and an input of the inverter, a second capacitor that includes a first end connected with an output of the inverter, a third transistor that is connected between a second end of the first capacitor and a power node, and a fourth transistor that is connected between a second end of the second capacitor and the power node. A gate of the third transistor is connected with the second end of the second capacitor, a gate of the fourth transistor is connected with the second end of the first capacitor, and a voltage of the second end of the second capacitor is an output of the voltage control circuit.

As an embodiment, the pre-driver includes a voltage control circuit that receives an inversion signal of the driving signal and outputs one of a first voltage and a second voltage in response to the inversion signal, a first transistor that outputs an output voltage of the voltage control circuit as the pull-down signal when the inversion signal is at a first level, and a second transistor that outputs a ground voltage as the pull-down signal when the inversion signal is at a second level.

According to an embodiment, an operating method of a transmitter which includes a first transistor and a second transistor connected between a power node and a ground node and transmits a voltage between the first transistor and the second transistor includes driving the first transistor with a first voltage in response to a first edge of a driving signal, driving the first transistor with a second voltage after a given time, and driving the first transistor with a third voltage in response to a second edge of the driving signal, and the second voltage is lower than the first voltage and is higher than the third voltage.

As an embodiment, the second voltage is a power supply voltage, the first voltage is two times the second voltage, and the third voltage is a ground voltage.

As an embodiment, the method further includes driving the second transistor with the first voltage in response to the second edge of the driving signal, driving the second transistor with the second voltage after the given time, and driving the second transistor with the third voltage in response to a third edge of the driving signal.

As an embodiment, the transmitter includes a delay, and the given time corresponds to a delay time of the delay.

According to an embodiment, a transmitter includes a pull-up transistor and a pull-down transistor that are connected between a power node and a ground node, a first voltage control circuit that receives a driving signal and outputs one of a first voltage and a second voltage in response to the driving signal, a first transistor that outputs an output voltage of the first voltage control circuit to a gate of the pull-up transistor when the driving signal is at a first level, a second transistor that outputs a ground voltage to the gate of the pull-up transistor when the driving signal is at a second level, a second voltage control circuit that receives the driving signal and outputs one of the first voltage and the second voltage in response to the driving signal, a third transistor that outputs an output voltage of the second voltage control circuit to a gate of the pull-down transistor when the driving signal is at the second level, and a fourth transistor that outputs the ground voltage to the gate of the pull-down transistor when the driving signal is at the first level.

As an embodiment, the first voltage control circuit outputs the first voltage in response to that the driving signal is set to the first level and outputs the second voltage in response to that a given time passes after the driving signal is set to the first level.

As an embodiment, the second voltage control circuit outputs the first voltage in response to that the driving signal is set to the second level and outputs the second voltage in response to that a given time passes after the driving signal is set to the second level.

As an embodiment, the first voltage control circuit includes a delay that delays and output the driving signal, an inverter that inverts and outputs an output signal of the inverter, a first capacitor that includes a first end connected between an output of the delay and an input of the inverter, a second capacitor that includes a first end connected with an output of the inverter, a third transistor that is connected between a second end of the first capacitor and a power node, and a fourth transistor that is connected between a second end of the second capacitor and the power node. A gate of the third transistor is connected with the second end of the second capacitor, a gate of the fourth transistor is connected with the second end of the first capacitor, and a voltage of the second end of the second capacitor is an output of the first voltage control circuit.

As an embodiment, the second voltage control circuit includes an input inverter that inverts the driving signal to output an inversion signal, a delay that delays and outputs the inversion signal, an inverter that inverts and outputs an output signal of the inverter, a first capacitor that includes a first end connected between an output of the delay and an input of the inverter, a second capacitor that includes a first end connected with an output of the inverter, a third transistor that is connected between a second end of the first capacitor and a power node, and a fourth transistor that is connected between a second end of the second capacitor and the power node. A gate of the third transistor is connected with the second end of the second capacitor, a gate of the fourth transistor is connected with the second end of the first capacitor, and a voltage of the second end of the second capacitor is an output of the second voltage control circuit.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the invention.

Figure 1:
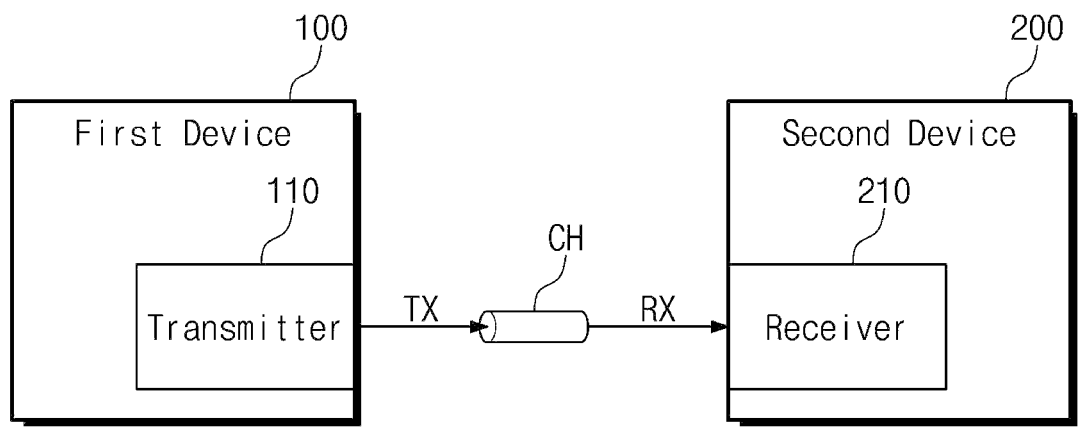
FIG. 1 illustrates a first device and a second device according to an embodiment of the present disclosure.

FIG. 1 illustrates a first device 100 and a second device 200 according to an embodiment of the present disclosure. The first device 100 and the second device 200 may be components of an electronic device such as a mobile device or a computing device. For example, one of the first device 100 and the second device 200 may be a random access memory that is used as a main memory. The other of the first device 100 and the second device 200 may include a central processing unit, an application processor, a graphics processor, a neural processor, a neuromorphic processor, etc., which access the random access memory.

The first device 100 may include a transmitter 110 configured to transmit a transmit signal TX. Under control of the first device 100, the transmitter 110 may output a signal, which the first device 100 intends to transmit to the second device 200, as the transmit signal TX. The transmit signal TX may be transferred to a channel CH.

The second device 200 may include a receiver 210 configured to receive a receive signal RX from the channel CH. The receiver 210 may sample the receive signal RX and may transfer the sampled signal to an internal circuit of the second device 200.

The channel CH may transfer the transmit signal TX from the transmitter 110 to the receiver 210 as the receive signal RX. The channel CH may be variously implemented in the form of a printed circuit wire of a printed circuit board (PCB), a connector, or a cable. The channel CH may have a frequency response characteristic of a low pass filter (LPF). Accordingly, the channel CH may attenuate a high-frequency component of the transmit signal TX so as to be transferred as the receive signal RX.

In an embodiment, a unidirectional communication example in which the first device 100 sends a signal to the second device 200 is illustrated in FIG. 1. However, the second device 200 may also include a transmitter for transferring a signal to the first device 100, and the first device 100 may also include a receiver for receiving the signal from the second device 200. A configuration and an operation of the transmitter of the second device 200 may be identical to those of the transmitter 110 of the first device 100. A configuration and an operation of the receiver of the first device 100 may be identical to those of the receiver 210 of the second device 200.

Figure 2:
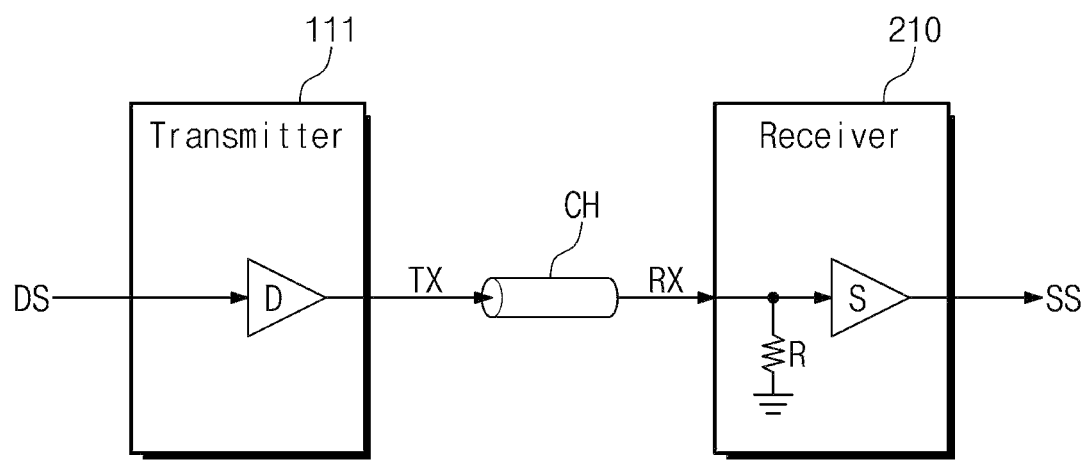
FIG. 2 illustrates a receiver, and a transmitter according to a first embodiment.

FIG. 2 illustrates the receiver 210, and a transmitter 111 according to a first embodiment. Referring to FIGS. 1 and 2, the transmitter 111 may include a driving circuit "D". The driving circuit "D" may receive a driving signal DS from an internal circuit of the first device 100. The driving signal DS may be a signal that the first device 100 intends to transfer to the second device 200. The driving circuit "D" may generate, from the driving signal DS, a voltage complying with a communication protocol and the transmit signal TX complying with a timing.

The receiver 210 may include a sample circuit "S" and a termination resistor "R". The termination resistor "R" may provide impedance matching for the channel CH. The sample circuit "S" may sample a level of the receive signal RX at given timings. The sample circuit "S" may output a result of the sampling as a sample signal SS. The sample signal SS may be transferred to an internal circuit of the second device 200.

Figure 3:
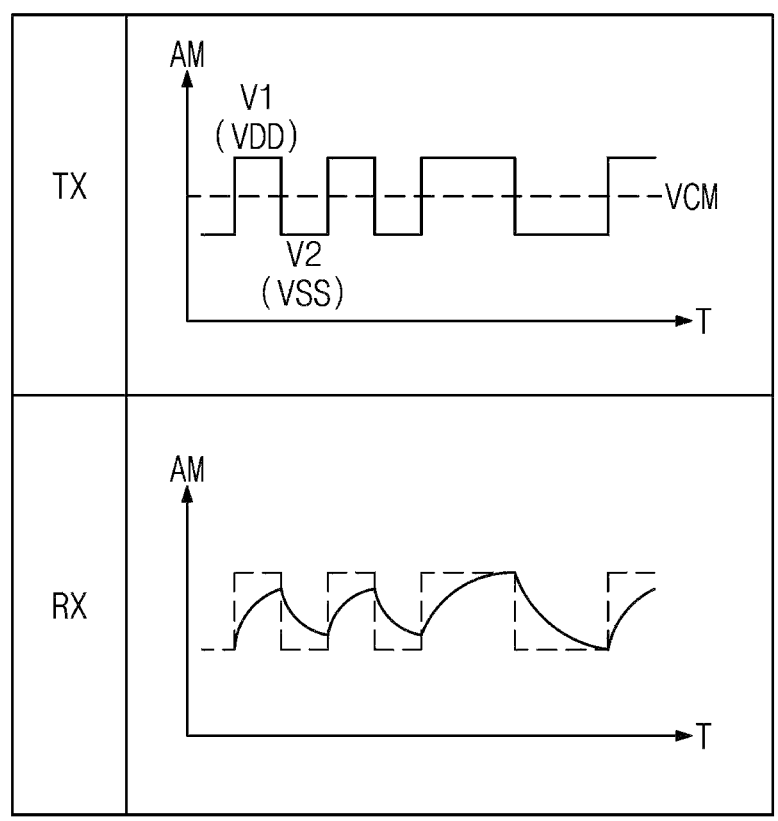
FIG. 3 illustrates an example of a transmit signal that a transmitter of FIG. 2 transmits and a receive signal that a receiver receives.

FIG. 3 illustrates an example of the transmit signal TX that the transmitter 111 of FIG. 2 transmits and the receive signal RX that the receiver 210 receives. In FIG. 3, a horizontal axis represents a time T, and a vertical axis represents an amplitude AM of a signal.

Referring to FIGS. 1, 2, and 3, the transmitter 111 may output the transmit signal TX having one of a first voltage V1 and a second voltage V2. A level of the first voltage V1 may be higher than a level of a common voltage VCM. A level of the second voltage V2 may be lower than the level of the common voltage VCM.

For example, the first voltage V1 may be a power supply voltage VDD, and the second voltage V2 may be a ground voltage VSS. The common voltage VCM may have a level between the power supply voltage (e.g., VDD) and the ground voltage (e.g., VSS).

The channel CH may attenuate a high-frequency component of the transmit signal TX. Accordingly, a waveform of the receive signal RX may be in the form of curves following a waveform of the transmit signal TX. In an embodiment, as illustrated in FIG. 3, because the receive signal RX follows the transmit signal TX at a speed slower than that of the transmit signal TX, when the transmit signal TX reaches the first voltage V1, the receive signal RX may increase only to a level lower than that of the first voltage V1. Also, when transmit signal TX reaches the second voltage V2, the receive signal RX may decrease only to a level higher than that of the second voltage V2.

When a voltage difference of a high level and a low level of the receive signal RX decreases, the probability that an error occurs when the sample circuit "S" samples the receive signal RX increases. In this case, a communication error may occur between the first device 100 and the second device 200.

Figure 4:
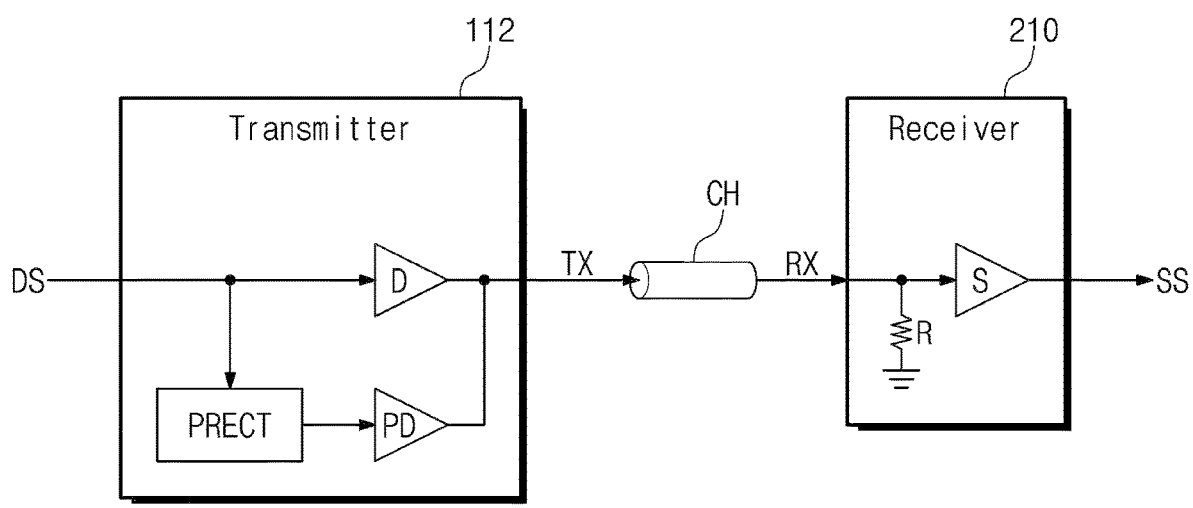
FIG. 4 illustrates a receiver, and a transmitter according to a second embodiment.

FIG. 4 illustrates the receiver 210, and a transmitter 112 according to a second embodiment. Referring to FIGS. 1 and 4, the transmitter 112 may include the driving circuit "D", a pre-emphasis driving circuit PD, and a pre-emphasis control circuit PRECT.

The pre-emphasis control circuit PRECT may control the pre-emphasis driving circuit PD such that an output is generated at a timing when the driving signal DS transitions (or toggles). The pre-emphasis driving circuit PD may generate an output in response to a control of the pre-emphasis control circuit PRECT.

Figure 5:
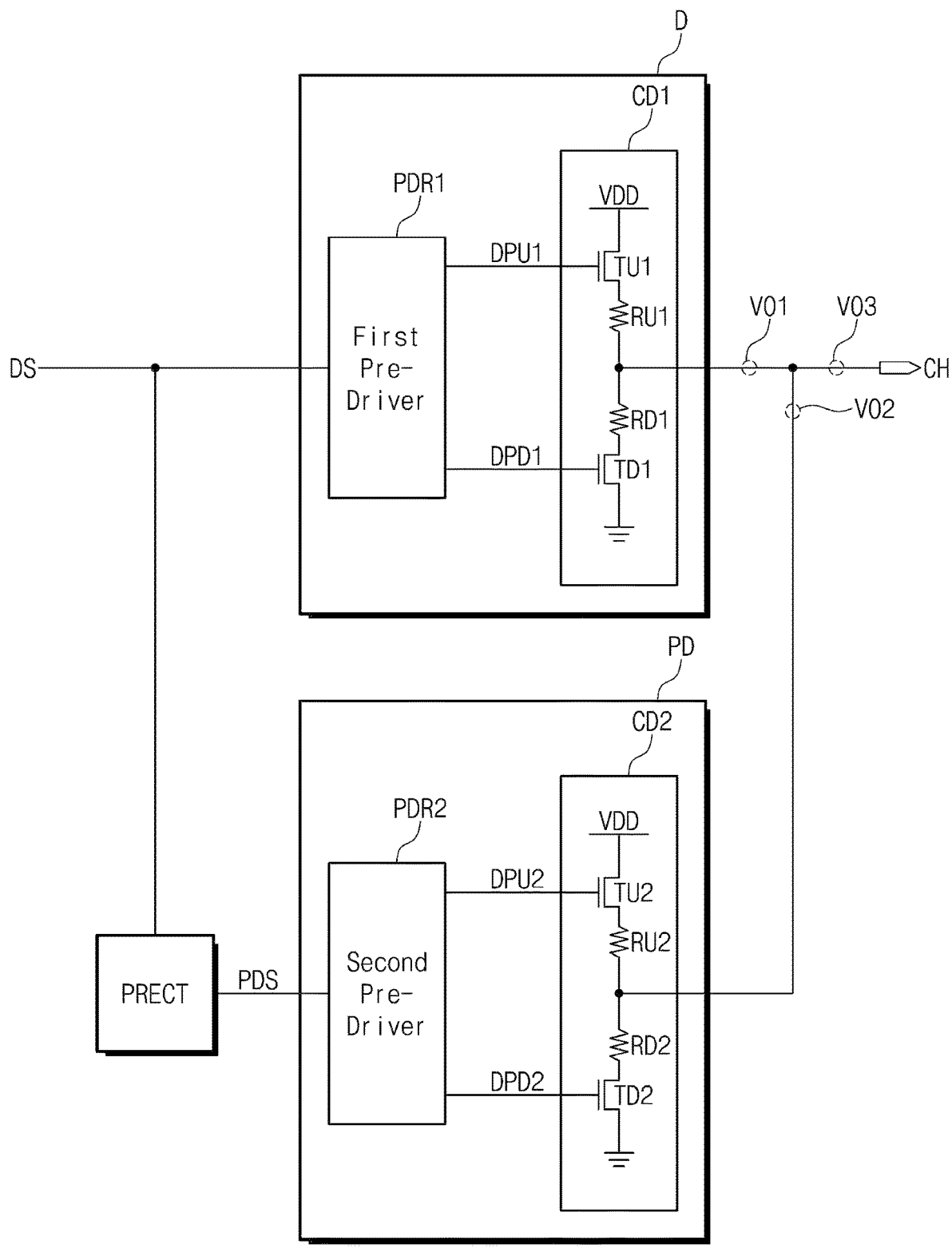
FIG. 5 illustrates a driving circuit and a pre-emphasis driving circuit in more detail.

FIG. 5 illustrates the driving circuit "D" and the pre-emphasis driving circuit PD in more detail. Referring to FIGS. 1, 4, and 5, the driving circuit "D" may include a first channel driver CD1 and a first pre-driver PDR1.

The first channel driver CD1 may include a first pull-up transistor TU1, a first pull-up resistor RU1, a first pull-down resistor RD1, and a first pull-down transistor TD1 that are connected between a power node to which the power supply voltage VDD is applied and a ground node to which the ground voltage VSS is applied.

A voltage of a node between the first pull-up resistor RU1 and the first pull-down resistor RD1 may be an output of the driving circuit "D", for example, a first output voltage VO1. The first pre-driver PDR1 may provide a first pull-up driving signal DPU1 to a gate of the first pull-up transistor TU1. The first pre-driver PDR1 may provide a first pull-down driving signal DPD1 to a gate of the first pull-down transistor TD1. The first pre-driver PDR1 may control, for example, turn on or turn off the first pull-up transistor TU1 and the first pull-down transistor TD1 by using the first pull-up driving signal DPU1 and the first pull-down driving signal DPD1.

The first pre-driver PDR1 may receive the driving signal DS. When the driving signal DS has the high level, the first pre-driver PDR1 may control the first pull-up driving signal DPU1 and the first pull-down driving signal DPD1 such that the first pull-up transistor TU1 is turned on and the first pull-down transistor TD1 is turned off.

When the driving signal DS has the low level, the first pre-driver PDR1 may control the first pull-up driving signal DPU1 and the first pull-down driving signal DPD1 such that the first pull-up transistor TU1 is turned off and the first pull-down transistor TD1 is turned on.

The pre-emphasis driving circuit PD may include a second channel driver CD2 and a second pre-driver PDR2.

The second channel driver CD2 may include a second pull-up transistor TU2, a second pull-up resistor RU2, a second pull-down resistor RD2, and a second pull-down transistor TD2 that are connected between the power node to which the power supply voltage VDD is applied and the ground node to which the ground voltage VSS is applied.

A voltage of a node between the second pull-up resistor RU2 and the second pull-down resistor RD2 may be an output of the pre-emphasis driving circuit PD, for example, a second output voltage VO2. The second pre-driver PDR2 may provide a second pull-up driving signal DPU2 to a gate of the second pull-up transistor TU2. The second pre-driver PDR2 may provide a second pull-down driving signal DPD2 to a gate of the second pull-down transistor TD2. The second pre-driver PDR2 may control, for example, turn on or turn off the second pull-up transistor TU2 and the second pull-down transistor TD2 by using the second pull-up driving signal DPU2 and the second pull-down driving signal DPD2.

The second pre-driver PDR2 may receive a pre-emphasis driving signal PDS. When the pre-emphasis driving signal PDS has the high level, the second pre-driver PDR2 may control the second pull-up driving signal DPU2 and the second pull-down driving signal DPD2 such that the second pull-up transistor TU2 is turned on and the second pull-down transistor TD2 is turned off.

When the pre-emphasis driving signal PDS has the low level, the second pre-driver PDR2 may control the second pull-up driving signal DPU2 and the second pull-down driving signal DPD2 such that the second pull-up transistor TU2 is turned off and the second pull-down transistor TD2 is turned on.

The pre-emphasis control circuit PRECT may control the second pre-driver PDR2 such that, at a rising edge of the driving signal DS, the second pull-up driving signal DPU2 transitions from the low level to the high level and then transitions from the high level to the low level. The pre-emphasis control circuit PRECT may control the second pre-driver PDR2 such that, at a falling edge of the driving signal DS, the second pull-down driving signal DPD2 transitions from the low level to the high level and then transitions from the high level to the low level.

The first output voltage VO1 and the second output voltage VO2 may be added to form a third output voltage VO3. The third output voltage VO3 may be transferred to the channel CH as the transmit signal TX.

Figure 6:
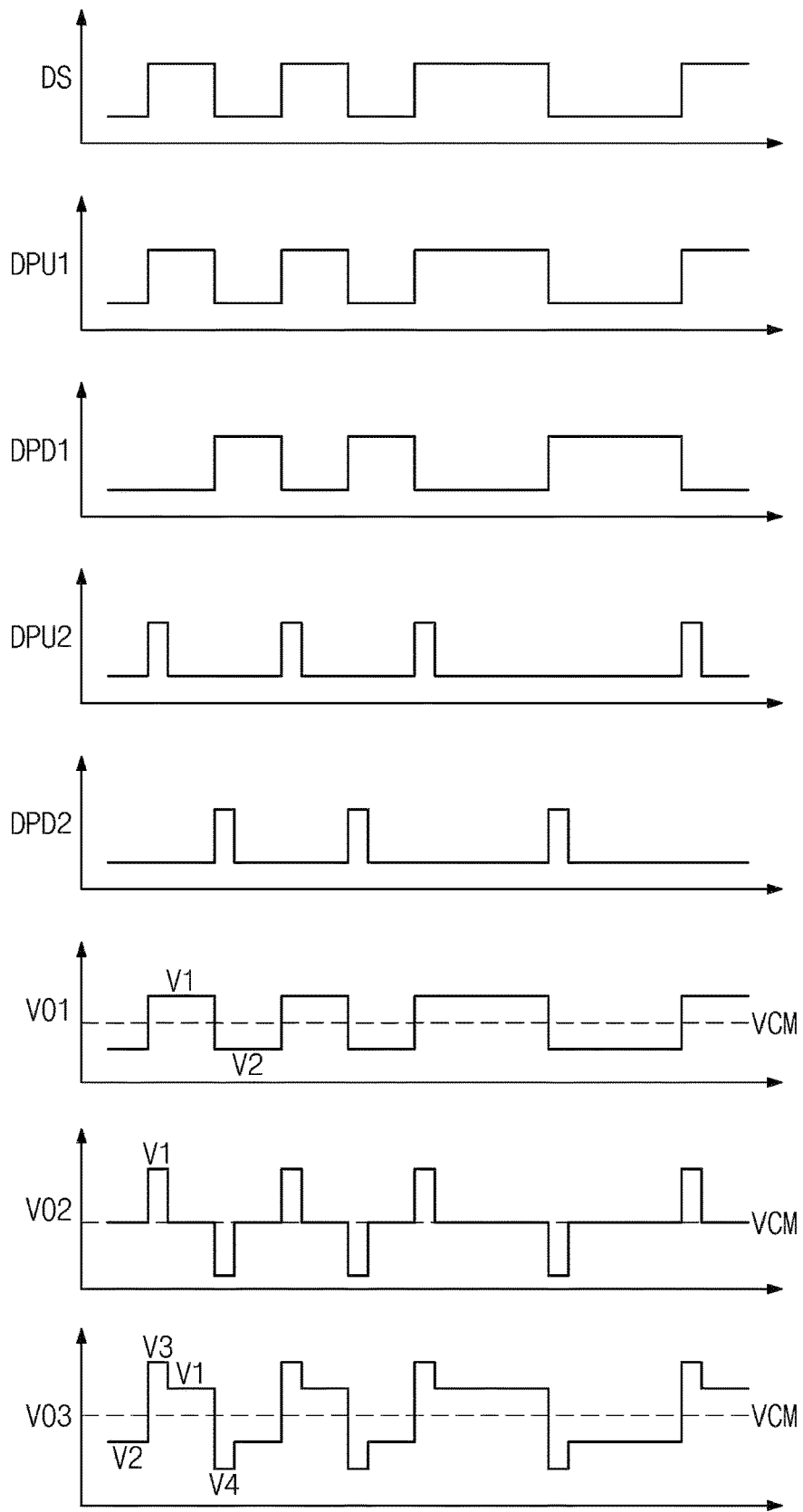
FIG. 6 illustrates an example of signals of a driving circuit and a pre-emphasis driving circuit of FIG. 5.

FIG. 6 illustrates an example of signals of the driving circuit "D" and the pre-emphasis driving circuit PD of FIG. 5. Referring to FIGS. 1, 4, 5, and 6, the driving signal DS may transition between the low level and the high level. The high level may correspond to the power supply voltage VDD, and the low level may correspond to the ground voltage VSS.

While the driving signal DS is at the high level, the first pull-up driving signal DPU1 may have the high level, and the first pull-down driving signal DPD1 may have the low level. The high level may be the power supply voltage VDD, and the low level may be the ground voltage VSS. Because the first pull-up transistor TU1 is turned on and the first pull-down transistor TD1 is turned off, during the high level of the driving signal DS, the first output voltage VO1 may correspond to the first voltage V1, for example, the power supply voltage VDD.

While the driving signal DS is at the low level, the first pull-up driving signal DPU1 may have the low level, and the first pull-down driving signal DPD1 may have the high level. The high level may be the power supply voltage VDD, and the low level may be the ground voltage VSS. Because the first pull-up transistor TU1 is turned off and the first pull-down transistor TD1 is turned on, during the low level of the driving signal DS, the first output voltage VO1 may correspond to the second voltage V2, for example, the ground voltage VSS.

In response to that the driving signal DS transitions from the low level to the high level, the second pull-up driving signal DPU2 may transition from the low level to the high level and may then transition from the high level to the low level. The second pull-down driving signal DPD2 may maintain the low level. The second pull-up transistor TU2 may be turned on and may then be turned off, and the second pull-down transistor TD2 may maintain a turn-off state. Accordingly, the second output voltage VO2 may rise from the common voltage VCM to the first voltage V1, for example, the power supply voltage VDD and may then return to the common voltage VCM.

In response to that the driving signal DS transitions from the high level to the low level, the second pull-down driving signal DPD2 may transition from the low level to the high level and may then transition from the high level to the low level. The second pull-up driving signal DPU2 may maintain the low level. The second pull-down transistor TD2 may be turned on and may then be turned off, and the second pull-up transistor TU2 may maintain a turn-off state. Accordingly, the second output voltage VO2 may fall from the common voltage VCM to the second voltage V2, for example, the ground voltage VSS and may then return to the common voltage VCM.

In an embodiment, the description is given as the second output voltage VO2 is the common voltage VCM while the second pull-up transistor TU2 and the second pull-down transistor TD2 are turned off, but this is only an example for showing that the pre-emphasis driving circuit PD does not output a voltage. The second output voltage VO2 is not limited to the common voltage VCM. The second output voltage VO2 may be implemented to follow the first output voltage VO1 or the third output voltage VO3.

In response to that the driving signal DS transitions from the low level to the high level, the first output voltage VO1 may start to rise to the first voltage V1, and the second output voltage VO2 may also start to rise to the first voltage V1. As an output current of the driving circuit "D" and an output current of the pre-emphasis driving circuit PD overlap each other, the third output voltage VO3 may be higher than the first voltage V1 (e.g., the power supply voltage VDD), that is, overshoot may occur.

After the overshoot occurs, when the output of the pre-emphasis driving circuit PD is blocked, the third output voltage VO3 may return to the first voltage V1.

In response to that the driving signal DS transitions from the high level to the low level, the first output voltage VO1 may start to fall to the second voltage V2, and the second output voltage VO2 may also start to fall to the second voltage V2. As the output current of the driving circuit "D" and the output current of the pre-emphasis driving circuit PD overlap each other, the third output voltage VO3 may be lower than the second voltage V2 (e.g., the ground voltage VSS), that is, undershoot may occur.

After the undershoot occurs, when the output of the pre-emphasis driving circuit PD is blocked, the third output voltage VO3 may return to the second voltage V2.

When the overshoot and the undershoot occur at the third output voltage VO3, a high-frequency component of the transmit signal TX may be emphasized. In terms of emphasizing a high-frequency component before a transmit signal is transmitted, pre-emphasis may be made.

Figure 7:
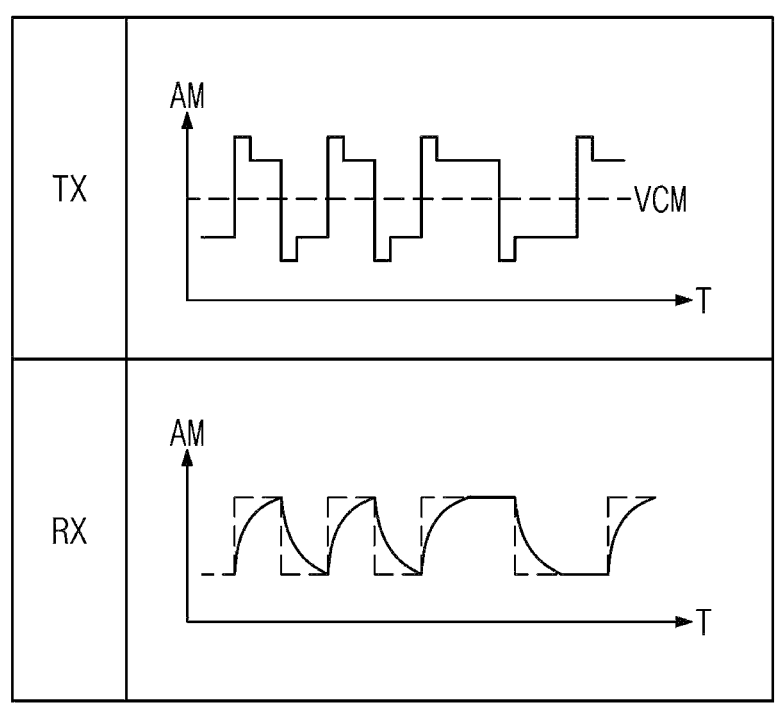
FIG. 7 illustrates an example of a transmit signal of a transmitter and a receive signal of a receiver of FIGS. 4 and 5.

FIG. 7 illustrates an example of the transmit signal TX of the transmitter 112 and the receive signal RX of the receiver 210 of FIGS. 4 and 5. In FIG. 7, a horizontal axis represents a time T, and a vertical axis represents an amplitude AM of a signal.

Compared to the receive signal RX of FIG. 3, as the pre-emphasis arise at the transmit signal TX, the high level of the receive signal RX may reach a level equal to the high level of the transmit signal TX, that is, may reach the first voltage V1. Also, the low level of the receive signal RX may reach a level equal to the low level of the transmit signal TX, that is, may reach the second voltage V2. Accordingly, a communication error may be prevented.

Figure 8:
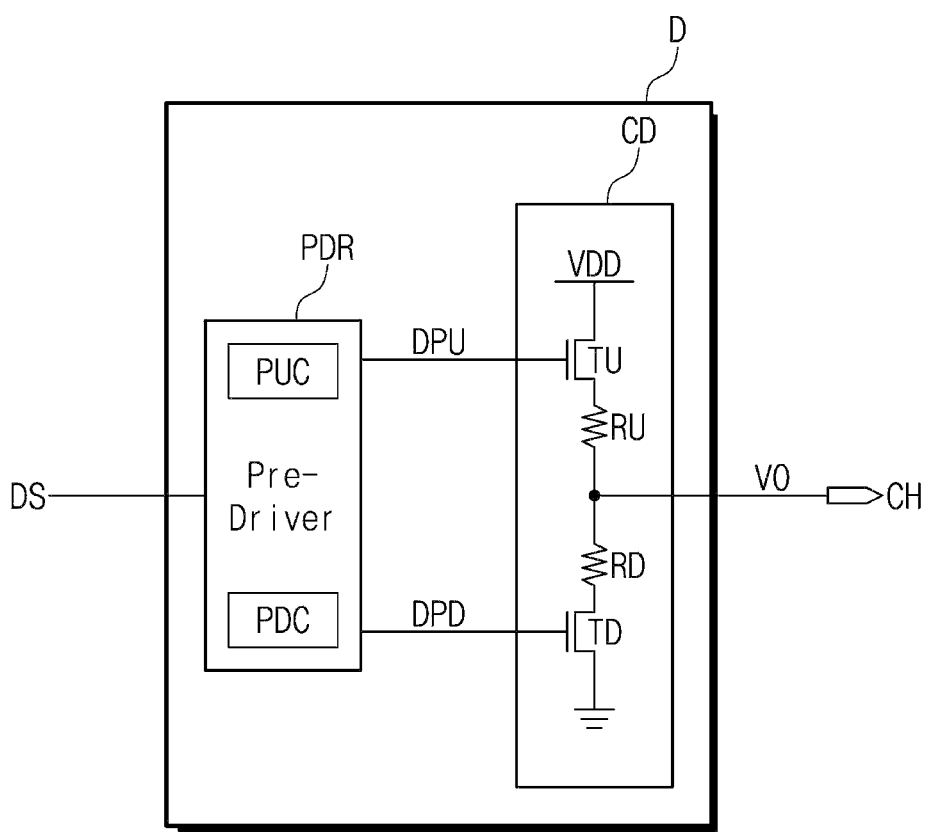
FIG. 8 illustrates another example of a driving circuit of a transmitter of FIG. 2.

FIG. 8 illustrates another example of the driving circuit "D" of the transmitter 111 of FIG. 2. Referring to FIGS. 1, 2, and 8, the driving circuit "D" may generate pre-emphasis at the output voltage VO without the pre-emphasis driving circuit PD. The driving circuit "D" may include a channel driver CD and a pre-driver PDR.

The channel driver CD may include a pull-up transistor TU, a pull-up resistor RU, a pull-down resistor RD, and a pull-down transistor TD that are connected between the power node to which the power supply voltage VDD is applied and the ground node to which the ground voltage VSS is applied.

A voltage of a node between the pull-up resistor RU and the pull-down resistor RD may be the output voltage VO of the driving circuit "D". The output voltage VO of the driving circuit "D" may be transferred to the channel CH. The pre-driver PDR may provide a pull-up driving signal DPU to a gate of the pull-up transistor TU. The pre-driver PDR may provide a pull-down driving signal DPD to a gate of the pull-down transistor TD.

The pre-driver PDR may receive the driving signal DS. The pre-driver PDR may include a pull-up controller PUC and a pull-down controller PDC. The pull-up controller PUC may output the pull-up driving signal DPU having one of three different voltages in response to the driving signal DS. The pull-down controller PDC may output the pull-down driving signal DPD having one of three different voltages in response to the driving signal DS.

Figure 9:
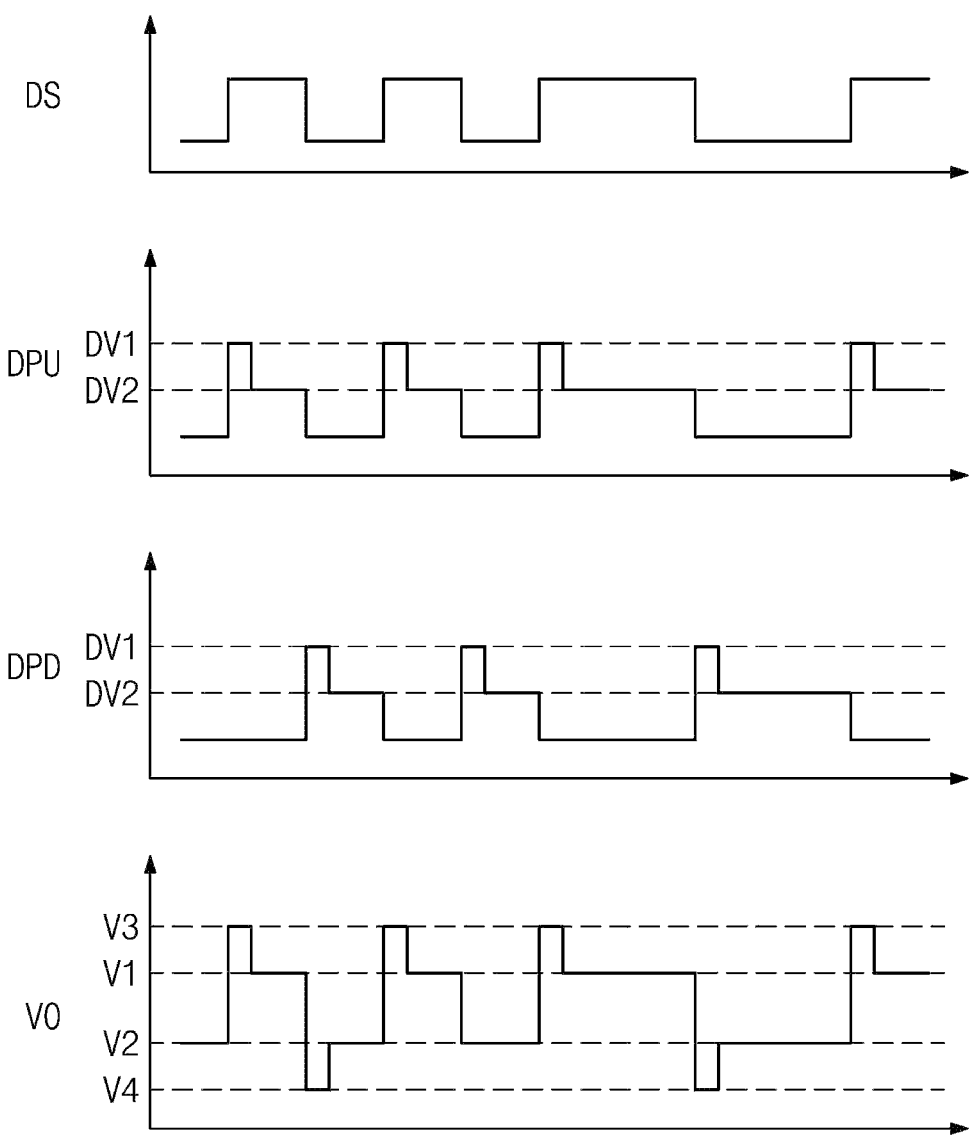
FIG. 9 illustrates an example of signals of a driving circuit of FIG. 8.

FIG. 9 illustrates an example of signals of the driving circuit "D" of FIG. 8. Referring to FIGS. 1, 2, 8, and 9, in response to that the driving signal DS transitions from the low level to the high level, the pull-up controller PUC may output a first driving voltage DV1 as the pull-up driving signal DPU. After a given time passes, the pull-up controller PUC may output a second driving voltage DV2 lower than the first driving voltage DV1 as the pull-up driving signal DPU. During the low level of the driving signal DS, the pull-up controller PUC may output the low level, for example, the ground voltage VSS as the pull-up driving signal DPU.

For example, the second driving voltage DV2 may be the power supply voltage VDD. The first driving voltage DV1 may be two times the power supply voltage VDD, for example, a double power supply voltage 2VDD. When the double power supply voltage 2VDD is applied to the pull-up transistor TU in response to that the driving signal DS transitions from the low level to the high level, a channel of the pull-up transistor TU may further widen, and the amount of current that is supplied to the output voltage VO through the pull-up transistor TU may increase (e.g., compared to the case where the power supply voltage VDD is applied to the pull-up transistor TU). Accordingly, the output voltage VO may rise to a third voltage V3 higher than the first voltage V1 (e.g., the power supply voltage VDD), that is, the overshoot may be made.

In response to that the driving signal DS transitions from the high level to the low level, the pull-down controller PDC may output the first driving voltage DV1 as the pull-down driving signal DPD. After a given time passes, the pull-down controller PDC may output the second driving voltage DV2 lower than the first driving voltage DV1 as the pull-down driving signal DPD. During the high level of the driving signal DS, the pull-down controller PDC may output the low level, for example, the ground voltage VSS as the pull-down driving signal DPD.

For example, the second driving voltage DV2 may be the power supply voltage VDD. The first driving voltage DV1 may be two times the power supply voltage VDD, for example, a double power supply voltage 2VDD. When the double power supply voltage 2VDD is applied to the pull-down transistor TD in response to that the driving signal DS transitions from the high level to the low level, a channel of the pull-down transistor TD may further widen, and the amount of current that is drained from the output voltage VO through the pull-down transistor TD may increase (e.g., compared to the case where the power supply voltage VDD is applied to the pull-down transistor TD). Accordingly, the output voltage VO may fall to a fourth voltage V4 lower than the second voltage V2 (e.g., the ground voltage VSS), that is, the undershoot may be made.

That is, the pre-driver PDR may generate the pre-emphasis at the output voltage VO without the pre-emphasis driving circuit PD by controlling each of the pull-up driving signal DPU and the pull-down driving signal DPD to three or more levels. Accordingly, there are provided the transmitter 111 and the operating method of the transmitter 111 capable of reducing an error of the transmit signal TX while reducing the area and complexity.

Figure 10:
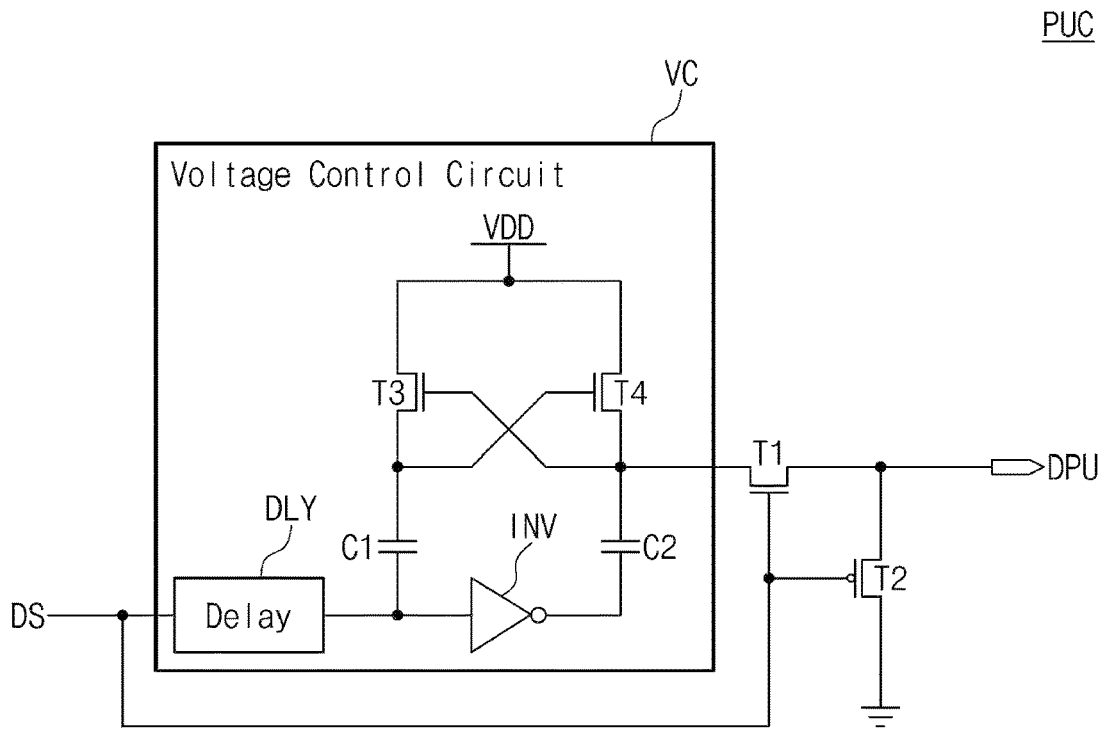
FIG. 10 illustrates an example of a pull-up controller.

FIG. 10 illustrates an example of the pull-up controller PUC. Referring to FIG. 10, the pull-up controller PUC may include a first transistor T1, a second transistor T2, and a voltage control circuit VC.

The first transistor T1 may be connected between an output of the voltage control circuit VC and an output of the pull-up controller PUC and may be controlled by the driving signal DS. During the high level of the driving signal DS, the first transistor T1 may output the output of the voltage control circuit VC as the pull-up driving signal DPU. During the low level of the driving signal DS, the first transistor T1 may prevent the output of the voltage control circuit VC from being output as the pull-up driving signal DPU.

The second transistor T2 may be connected between the output of the pull-up controller PUC and the ground node and may be controlled by the driving signal DS. During the low level of the driving signal DS, the second transistor T2 may output the ground voltage VSS as the pull-up driving signal DPU. During the high level of the driving signal DS, the ground voltage VSS may be prevented from being output as the pull-up driving signal DPU by the second transistor T2.

The voltage control circuit VC may include a delay DLY, a third transistor T3, a fourth transistor T4, a first capacitor C1, a second capacitor C2, and an inverter INV.

The delay DLY may delay and output the driving signal DS. A first end of the first capacitor C1 may be connected with an output of the delay DLY and an input of the inverter INV, and a second end of the first capacitor C1 may be connected with a first end of the third transistor T3 and a gate of the fourth transistor T4.

The inverter INV may invert and output an output of the delay DLY. A first end of the second capacitor C2 may be connected with an output of the inverter INV. A second end of the second capacitor C2 may be connected with a first end of the fourth transistor T4 and a gate of the third transistor T3.

The third transistor T3 may be connected between the first capacitor C1 and the power node. The fourth transistor T4 may be connected between the second capacitor C2 and the power node. The third transistor T3 and the fourth transistor T4 may be connected in a cross-coupled form.

The second end of the second capacitor C2 may be connected with the first transistor T1. When the first transistor T1 is turned on, a voltage of the second end of the second capacitor C2 may be output as the pull-up driving signal DPU.

Figure 11:
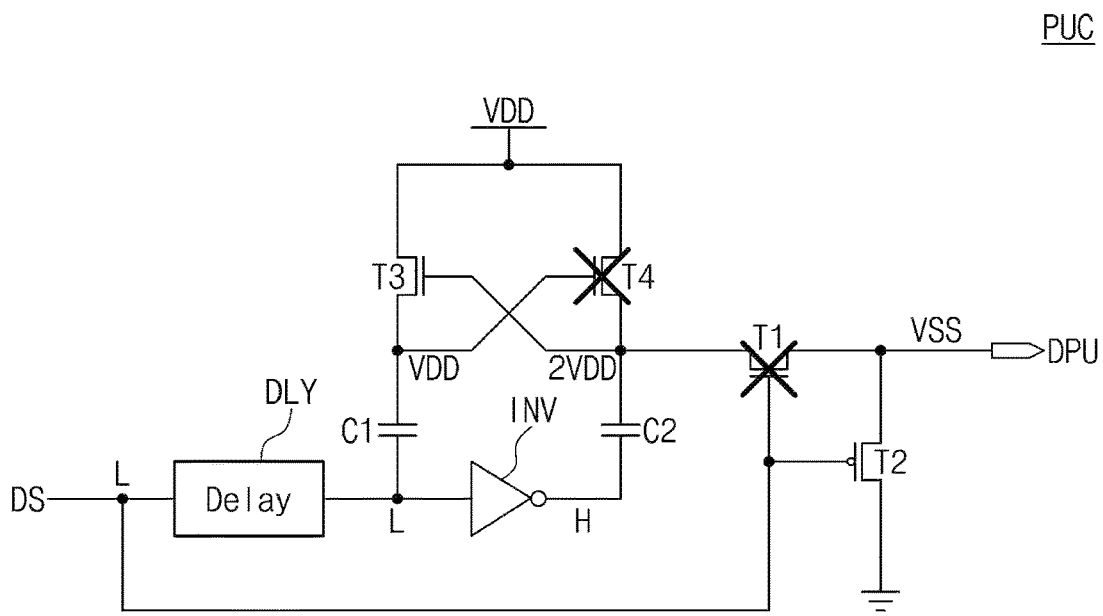
FIGS. 11 to 13 illustrate examples in which a pull-up controller operates.
Figure 12:
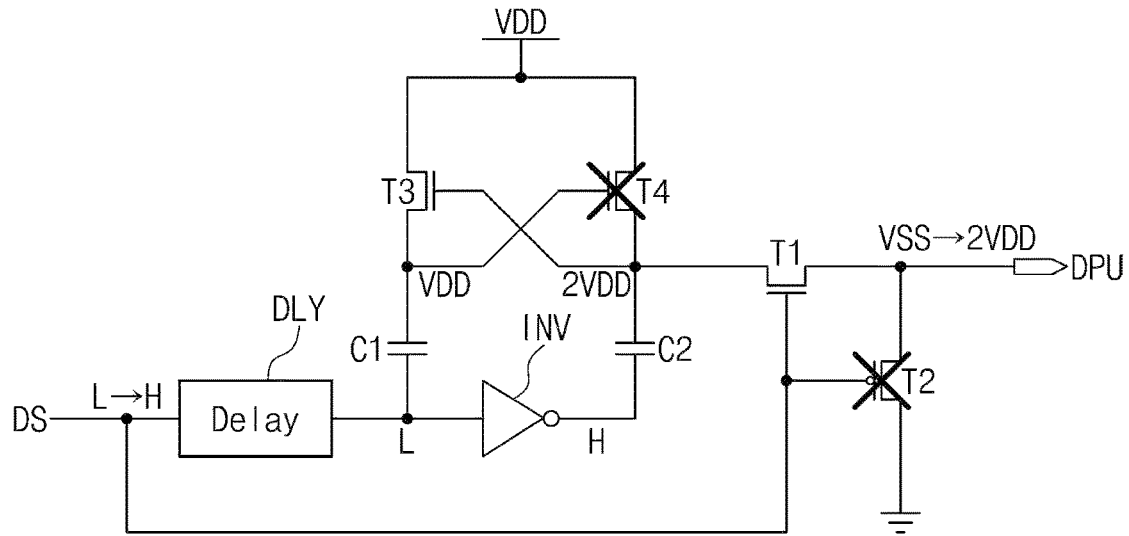
Figure 13:
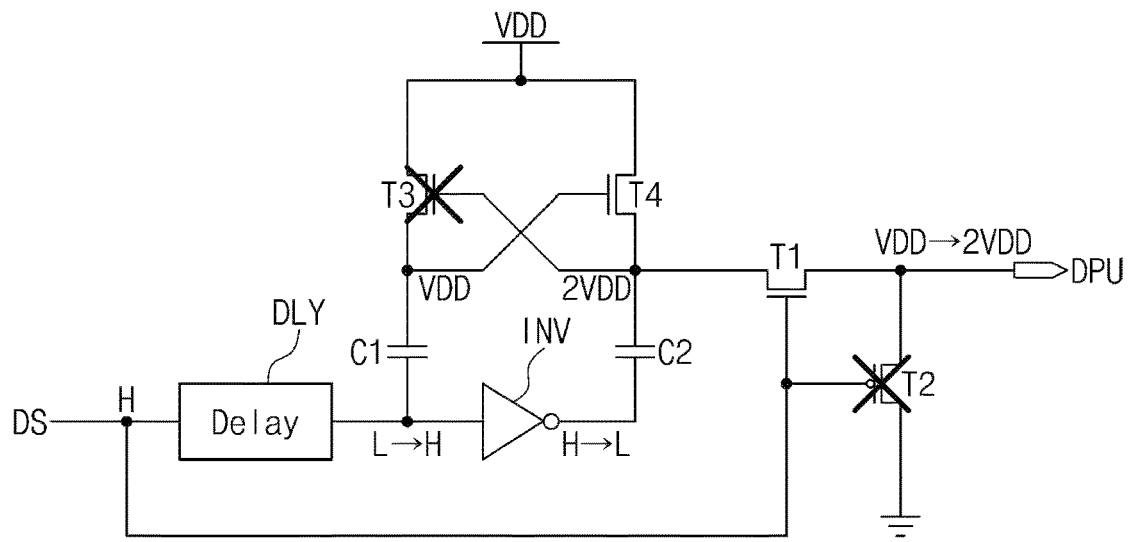

FIGS. 11 to 13 illustrate examples in which the pull-up controller PUC operates. Referring to FIG. 11, the driving signal DS may be at the low level "L", and an output of the delay DLY may be at the low level "L". An output of the inverter INV may be the high level "H". When the driving signal DS transitions to the low level "L" or the high level "H", the first end of the first capacitor C1 may transition to the low level "L" or the high level "H", and the first end of the second capacitor C2 may transition to the high level "H" or the low level "L". Accordingly, it is assumed that the power supply voltage VDD is charged to each of the first capacitor C1 and the second capacitor C2.

When the power supply voltage VDD is charged to the first capacitor C1 and the first end of the first capacitor C1 is at the low level "L", a voltage of the second end of the first capacitor C1 may be the power supply voltage VDD. Likewise, when the first end of the second capacitor C2 is at the low level "L", a voltage of the second end of the second capacitor C2 may be the double power supply voltage 2VDD. The third transistor T3 may be turned on, and the fourth transistor T4 may be turned off.

Because the driving signal DS is at the low level "L", the first transistor T1 may be turned off, and the second transistor T2 may be turned on. The pull-up controller PUC may output the ground voltage VSS as the pull-up driving signal DPU.

Referring to FIG. 12, the driving signal DS may transition from the low level "L" to the high level "H". The first transistor T1 may be turned on, and the second transistor T2 may be turned off. Accordingly, the pull-up controller PUC may output the double power supply voltage 2VDD as the pull-up driving signal DPU.

Referring to FIG. 13, after a delay time of the delay DLY passes, the output of the delay DLY may transition from the low level "L" to the high level "H". Accordingly, a voltage of the second end of the first capacitor C1 may be the power supply voltage VDD. The output of the inverter INV may transition from the high level "H" to the low level "L". Accordingly, a voltage of the second end of the second capacitor C2 may be the power supply voltage VDD. The third transistor T3 may be turned off, and the fourth transistor T4 may be turned on.

After the driving signal DS transitions from the low level "L" to the high level "H" and the delay time of the delay DLY passes, a voltage of the second end of the second capacitor C2 decreases from the double power supply voltage 2VDD to the power supply voltage VDD. Accordingly, the pull-up controller PUC may decrease the pull-up driving signal DPU from the double power supply voltage 2VDD to the power supply voltage VDD.

Figure 14:
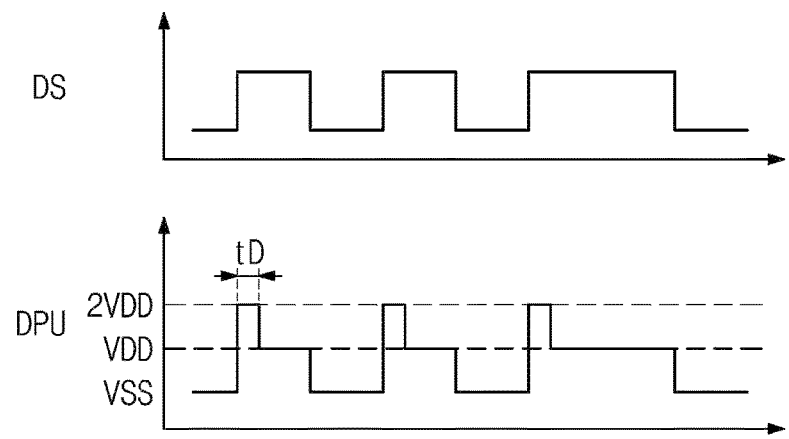
FIG. 14 illustrates an example in which a pull-up driving signal is generated from a driving signal.

FIG. 14 illustrates an example in which the pull-up driving signal DPU is generated from the driving signal DS. Referring to FIGS. 1, 2, 8, 10, and 14, in response to that the driving signal DS transitions from the low level "L" to the high level "H", the pull-up driving signal DPU may rise from the ground voltage VSS of the low level "L" to the double power supply voltage 2VDD. Afterwards, when a delay time tD of the delay DLY passes, the pull-up driving signal DPU may fall from the double power supply voltage 2VDD to the power supply voltage VDD. When the driving signal DS transitions from the high level "H" to the low level "L", the pull-up driving signal DPU may fall from the power supply voltage VDD to the ground voltage VSS.

Figure 15:
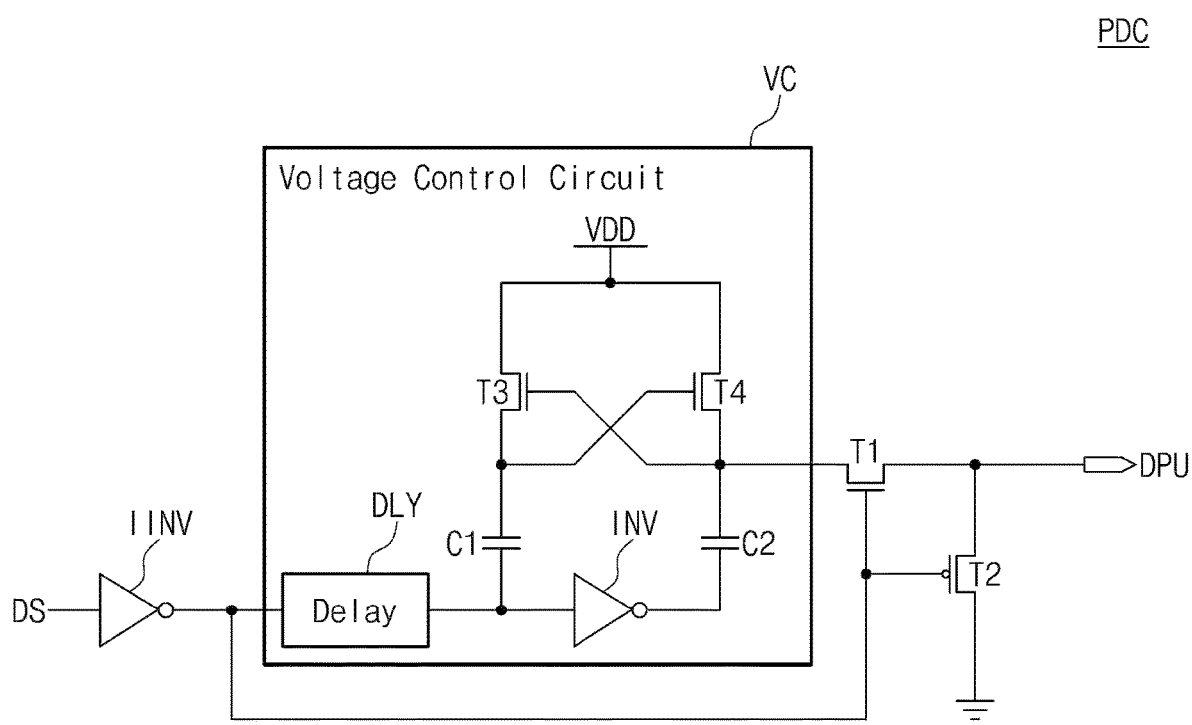
FIG. 15 illustrates an example of a pull-down controller.

FIG. 15 illustrates an example of the pull-down controller PDC. Compared with the pull-up controller PUC, the pull-down controller PDC may further include an input inverter IINV. A structure, an operation, and a configuration of the pull-down controller PDC may be identical to those of the pull-up controller PUC except that the pull-down controller PDC operates in response to not the driving signal DS but an inversion signal generated by inverting the driving signal DS. Thus, additional description will be omitted to avoid redundancy.

Figure 16:
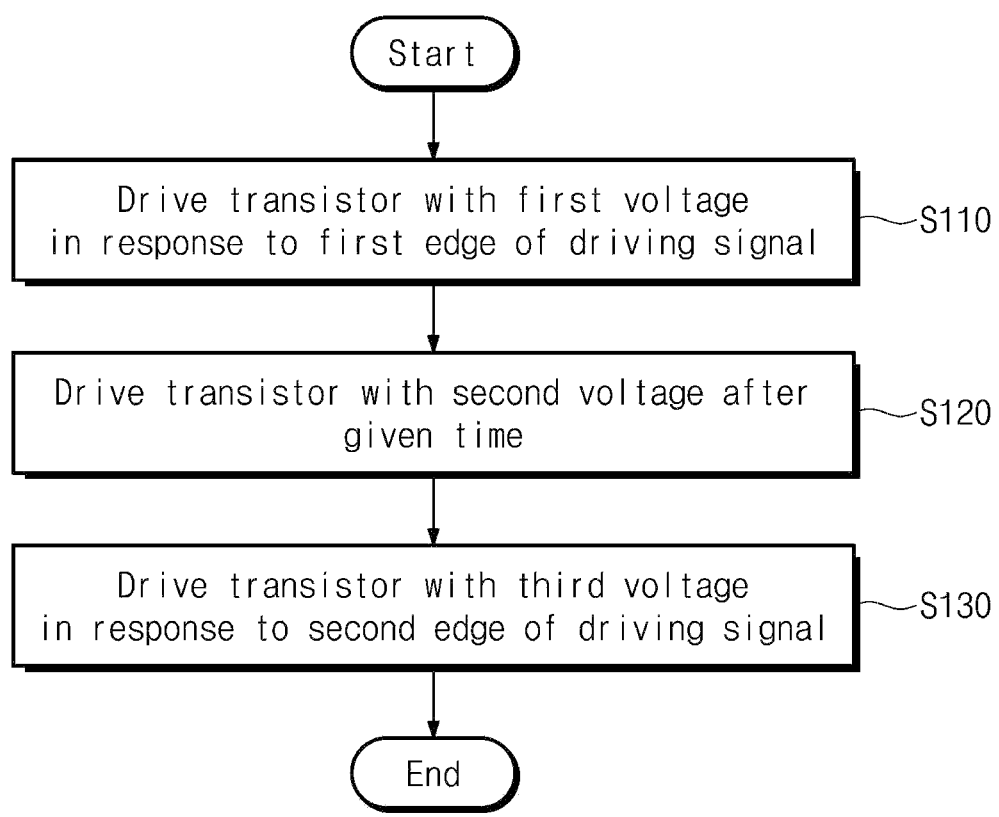
FIG. 16 illustrates an example of an operating method of a transmitter according to an embodiment of the present disclosure.

FIG. 16 illustrates an example of an operating method of the transmitter 111 according to an embodiment of the present disclosure. Referring to FIGS. 1, 2, 8, 10, and 16, in operation S110, the transmitter 111 may drive a transistor (e.g., the pull-up transistor TU or the pull-down transistor TD) with a first voltage in response to a first edge (e.g., a rising edge or a falling edge) of the driving signal DS. The first voltage may be the double power supply voltage 2VDD.

In operation S120, the transmitter 111 may drive a transistor (e.g., the pull-up transistor TU or the pull-down transistor TD) with a second voltage after a given time (e.g., the delay time tD of the delay DLY) passes. The second voltage may be the power supply voltage VDD.

In operation S130, the transmitter 111 may drive a transistor (e.g., the pull-up transistor TU or the pull-down transistor TD) with a third voltage in response to a second edge (e.g., the falling edge or the rising edge) of the driving signal DS. The third voltage may be the ground voltage VSS.

The transmitter 111 may perform operation S110 to operation S130 on the pull-up transistor TU in response to the rising edge and the falling edge of the driving signal DS. Also, the transmitter 111 may perform operation S110 to operation S130 on the pull-down transistor TD in response to the falling edge and the rising edge of the driving signal DS.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to the present disclosure, a transmitter transmits a signal, to which pre-emphasis is applied, without including a separate pre-emphasis circuit directly connected with an output node thereof. Accordingly, there are provided a transmitter and an operating method of the transmitter capable of reducing an error of a transmit signal while reducing the area and complexity.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A transmitter comprising:
a channel driver including a pull-up transistor and a pull-down transistor connected between a power node and a ground node, and configured to output a voltage between the pull-up transistor and the pull-down transistor as a transmit signal; and
a pre-driver configured to control the pull-up transistor and the pull-down transistor in response to a driving signal and to control the channel driver such that the transmit signal is overshot at a rising edge of the driving signal and the transmit signal is undershot at a falling edge of the driving signal, wherein the pre-driver causes the overshoot and the undershoot of the transmit signal by adjusting a level of a pull-up signal to be applied to the pull-up transistor, wherein the pre-driver adjusts the pull-up signal to a first level at the rising edge of the driving signal, and wherein the first level is two times a power supply voltage.

2. The transmitter of claim 1, wherein the pre-driver further causes the overshoot and the undershoot of the transmit signal by adjusting a level of a pull-down signal to be applied to the pull-down transistor.

3. The transmitter of claim 2, wherein the pre-driver further adjusts the pull-up signal to a second level lower than the first level after a given time.

4. The transmitter of claim 3, wherein the pre-driver adjusts the pull-up signal to a third level lower than the second level at the falling edge of the driving signal.

5. The transmitter of claim 3, wherein the second level is a power supply voltage.

6. The transmitter of claim 2, wherein the pre-driver adjusts the pull-down signal to a first level at the falling edge of the driving signal and adjusts the pull-down signal to a second level lower than the first level after a given time.

7. The transmitter of claim 6, wherein the pre-driver adjusts the pull-down signal to a third level lower than the second level at the rising edge of the driving signal.

8. The transmitter of claim 2, wherein the pre-driver includes:
a voltage control circuit configured to receive the driving signal and to output one of a first voltage and a second voltage in response to the driving signal;
a first transistor configured to output an output voltage of the voltage control circuit as the pull-up signal when the driving signal is at a first level; and
a second transistor configured to output a ground voltage as the pull-up signal when the driving signal is at a second level.

9. The transmitter of claim 8, wherein the voltage control circuit includes:
a delay configured to delay and output the driving signal;
an inverter configured to invert and output an output signal of the inverter;
a first capacitor including a first end connected between an output of the delay and an input of the inverter;
a second capacitor including a first end connected with an output of the inverter;
a third transistor connected between a second end of the first capacitor and a power node; and
a fourth transistor connected between a second end of the second capacitor and the power node,
wherein a gate of the third transistor is connected with the second end of the second capacitor,
wherein a gate of the fourth transistor is connected with the second end of the first capacitor, and
wherein a voltage of the second end of the second capacitor is an output of the voltage control circuit.

10. The transmitter of claim 2, wherein the pre-driver includes:
a voltage control circuit configured to receive an inversion signal of the driving signal and to output one of a first voltage and a second voltage in response to the inversion signal;
a first transistor configured to output an output voltage of the voltage control circuit as the pull-down signal when the inversion signal is at a first level; and
a second transistor configured to output a ground voltage as the pull-down signal when the inversion signal is at a second level.

11. An operating method of a transmitter which includes a first transistor and a second transistor connected between a power node and a ground node and transmits a voltage between the first transistor and the second transistor, the method comprising:
driving the first transistor with a first voltage in response to a first edge of a driving signal;
driving the first transistor with a second voltage after a given time; and
driving the first transistor with a third voltage in response to a second edge of the driving signal,
wherein the second voltage is lower than the first voltage and is higher than the third voltage,
wherein the first voltage is two times the second voltage.

12. The method of claim 11, wherein the second voltage is a power supply voltage, and
wherein the third voltage is a ground voltage.

13. The method of claim 11, further comprising:
driving the second transistor with the first voltage in response to the second edge of the driving signal;
driving the second transistor with the second voltage after the given time; and
driving the second transistor with the third voltage in response to a third edge of the driving signal.

14. The method of claim 11, wherein the transmitter includes a delay, and
wherein the given time corresponds to a delay time of the delay.

15. A transmitter comprising:
a pull-up transistor and a pull-down transistor connected between a power node and a ground node;
a first voltage control circuit configured to receive a driving signal and to output one of a first voltage and a second voltage in response to the driving signal;
a first transistor configured to output an output voltage of the first voltage control circuit to a gate of the pull-up transistor when the driving signal is at a first level;
a second transistor configured to output a ground voltage to the gate of the pull-up transistor when the driving signal is at a second level;
a second voltage control circuit configured to receive the driving signal and to output one of the first voltage and the second voltage in response to the driving signal;
a third transistor configured to output an output voltage of the second voltage control circuit to a gate of the pull-down transistor when the driving signal is at the second level; and
a fourth transistor configured to output the ground voltage to the gate of the pull-down transistor when the driving signal is at the first level,
wherein the first voltage is two times the second voltage.

16. The transmitter of claim 15, wherein the first voltage control circuit outputs the first voltage in response to that the driving signal is set to the first level and outputs the second voltage in response to that a given time passes after the driving signal is set to the first level.

17. The transmitter of claim 15, wherein the second voltage control circuit outputs the first voltage in response to that the driving signal is set to the second level and outputs the second voltage in response to that a given time passes after the driving signal is set to the second level.

18. The transmitter of claim 15, wherein the first voltage control circuit includes:
- a delay configured to delay and output the driving signal;
- an inverter configured to invert and output an output signal of the inverter;
- a first capacitor including a first end connected between an output of the delay and an input of the inverter;
- a second capacitor including a first end connected with an output of the inverter;
- a third transistor connected between a second end of the first capacitor and a power node; and
- a fourth transistor connected between a second end of the second capacitor and the power node,
- wherein a gate of the third transistor is connected with the second end of the second capacitor,
- wherein a gate of the fourth transistor is connected with the second end of the first capacitor, and
- wherein a voltage of the second end of the second capacitor is an output of the first voltage control circuit.

19. The transmitter of claim 15, wherein the second voltage control circuit includes:
- an input inverter configured to invert the driving signal to output an inversion signal;
- a delay configured to delay and output the inversion signal;
- an inverter configured to invert and output an output signal of the inverter;
- a first capacitor including a first end connected between an output of the delay and an input of the inverter;
- a second capacitor including a first end connected with an output of the inverter;
- a third transistor connected between a second end of the first capacitor and a power node; and
- a fourth transistor connected between a second end of the second capacitor and the power node,
- wherein a gate of the third transistor is connected with the second end of the second capacitor,
- wherein a gate of the fourth transistor is connected with the second end of the first capacitor, and
- wherein a voltage of the second end of the second capacitor is an output of the second voltage control circuit.

* * * * *